(12) United States Patent
Ogata

(10) Patent No.: US 9,024,662 B2
(45) Date of Patent: *May 5, 2015

(54) SEMICONDUCTOR INTEGRATED CIRCUIT

(71) Applicant: Sony Corporation, Tokyo (JP)

(72) Inventor: Hiromi Ogata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/224,910

(22) Filed: Mar. 25, 2014

(65) Prior Publication Data

US 2014/0203330 A1    Jul. 24, 2014

Related U.S. Application Data

(63) Continuation of application No. 13/551,353, filed on Jul. 17, 2012, now Pat. No. 8,742,793, which is a continuation of application No. 13/064,731, filed on Apr. 12, 2011, now Pat. No. 8,299,818, which is a continuation of application No. 12/656,219, filed on Jan. 21, 2010, now Pat. No. 7,944,243, which is a continuation of application No. 12/285,375, filed on Oct. 2, 2008, now Pat. No. 7,750,681.

(30) Foreign Application Priority Data

Nov. 7, 2007 (JP) .................. 2007-289250

(51) Int. Cl.
*H03K 19/00* (2006.01)
*H01L 23/528* (2006.01)
*H01L 27/02* (2006.01)

(52) U.S. Cl.
CPC .......... *H01L 23/528* (2013.01); *H01L 23/5286* (2013.01); *H01L 27/0203* (2013.01); *H01L 27/0207* (2013.01); *H01L 2924/3011* (2013.01); *H03K 19/0016* (2013.01); *H01L 2924/0002* (2013.01)

(58) Field of Classification Search
USPC ................. 326/37–41, 93–103; 257/202, 207
See application file for complete search history.

(56) References Cited

U.S. PATENT DOCUMENTS 5,291,445 A    3/1994  Miyaoka et al.
5,300,796 A    4/1994  Shintani
(Continued)

FOREIGN PATENT DOCUMENTS

JP    2004-165453 A    6/2004
JP    2005-259879       9/2005
(Continued)

OTHER PUBLICATIONS

Japanese Office Action issued Sep. 24, 2009 for corresponding Japanese Application No. 2007-289250.

(Continued)

*Primary Examiner* — Don Le
(74) *Attorney, Agent, or Firm* — Fishman Stewart Yamaguchi PLLC

(57) ABSTRACT

A semiconductor integrated circuit includes: a main-interconnect to which supply voltage or reference voltage is applied; a plurality of sub-interconnects; a plurality of circuit cells configured to be connected to the plurality of sub-interconnects; a power supply switch cell configured to control, in accordance with an input control signal, connection and disconnection between the main-interconnect and the sub-interconnect to which a predetermined one of the circuit cells is connected, of the plurality of sub-interconnects; and an auxiliary interconnect configured to connect the plurality of sub-interconnects to each other.

20 Claims, 7 Drawing Sheets

(56) References Cited

U.S. PATENT DOCUMENTS

| | | | |
|---|---|---|---|
| 6,107,869 | A | 8/2000 | Horiguchi et al. |
| 6,900,478 | B2 | 5/2005 | Miyagi |
| 6,989,686 | B2 | 1/2006 | Arakawa |
| 7,274,210 | B2 | 9/2007 | Ogata et al. |
| 8,191,026 | B2 * | 5/2012 | Motomura .................... 716/119 |
| 2009/0079465 | A1 | 3/2009 | Sasaki et al. |
| 2009/0179688 | A1 | 7/2009 | Igarashi et al. |

FOREIGN PATENT DOCUMENTS

| | | |
|---|---|---|
| JP | 2005-286082 A | 10/2005 |
| JP | 2006-140363 A | 6/2006 |
| JP | 2006-344640 A | 12/2006 |
| JP | 2007-208120 A | 8/2007 |
| JP | 2008-066740 A | 3/2008 |
| KR | 2006-0043789 A | 5/2006 |
| WO | WO-2006/114875 A1 | 11/2006 |

OTHER PUBLICATIONS

Japanese Office Action issued Dec. 22, 2009 for corresponding Japanese Application No. 2007-289250.

Japanese Office Action issued Oct. 9, 2012 for related Japanese Application No. 2009-266037.

Japanese Office Action issued Jan. 7, 2014 for corresponding Japanese Application No. 2012-203518.

Korean Office Action issued Feb. 9, 2015 for corresponding Korean Application No. 10-2008-0109699.

Japanese Office Action issued Mar. 2, 2015 for corresponding Japanese Application No. 2014-046170.

* cited by examiner

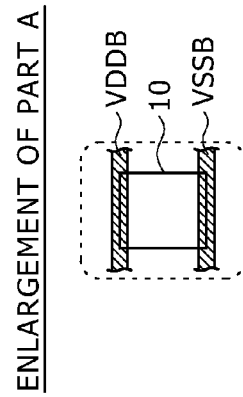
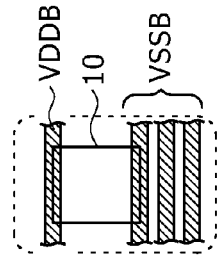
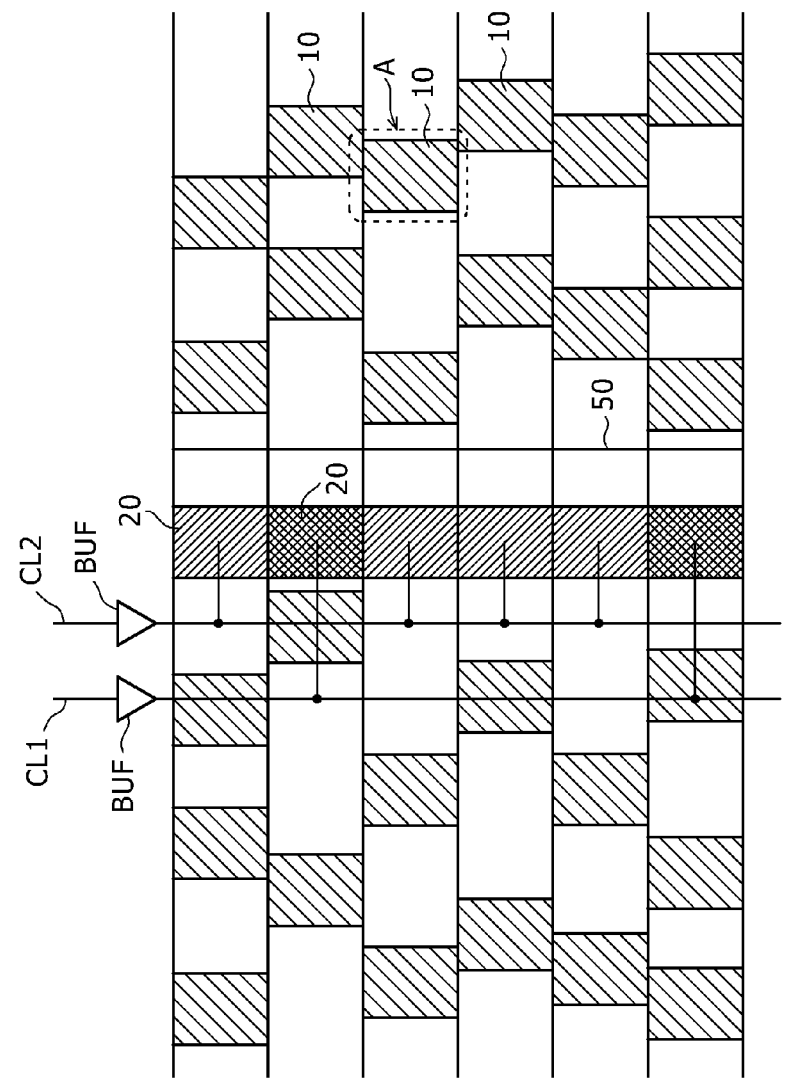

SEMICONDUCTOR INTEGRATED CIRCUIT

CROSS REFERENCES TO RELATED APPLICATIONS

This application is a Continuation of application Ser. No. 13/551,353, filed on Jul. 17, 2012, which is a Continuation of application Ser. No. 13/064,731, filed Apr. 12, 2011, now U.S. Pat. No. 8,299,818, issued on Oct. 30, 2012, which is a Continuation of application Ser. No. 12/656,219, filed Jan. 21, 2010, now U.S. Pat. No. 7,944,243, issued on May 17, 2011, which is a Continuation of application Ser. No. 12/285,375, filed Oct. 2, 2008, now U.S. Pat. No. 7,750,681, issued on Jul. 6, 2010, which claims priority from Japanese Application Number 2007-289250, filed on Nov. 7, 2007, the entire contents of which are incorporated herein by reference.

BACKGROUND OF THE INVENTION

1. Field of the Invention

The present invention relates to a semiconductor integrated circuit having a power supply switch cell that controls supplying of supply voltage or reference voltage to a circuit cell and blocking of the voltage supplying.

2. Description of Related Art

To control supplying of supply voltage or reference voltage to a circuit cell and blocking of the voltage supplying is known as, for example, a circuit technique called multi-threshold complementary metal oxide semiconductor (MTCMOS). In the MTCMOS, for example, for each circuit block having a specific function, a power supply switch transistor with threshold voltage higher than that of a transistor in a functional circuit is connected to the path of the supplying of the supply voltage or the reference voltage (e.g. GND voltage). When the circuit block enters the unused state, the power supply switch transistor is set to the off-state, so that the leakage current that flows through the respective transistors in the circuit block is blocked. This can significantly reduce the leakage current that flows through the circuit block in the unused state.

For the purpose of eliminating a troublesome task of arranging power supply switch transistors based on manpower in design of a semiconductor integrated circuit including a circuit block to which the MTCMOS technique is applied, the inventors of the present application have already proposed a semiconductor integrated circuit in which power supply switch transistors are included as cells and the power supply switch cells are properly disposed in the area in which circuit cells are arranged (refer to Japanese Patent Laid-open No. 2005-259879 (hereinafter referred to as Patent Document1)).

SUMMARY OF THE INVENTION

There is a need for the present invention to add improvement to the semiconductor integrated circuit with the structure in which the power supply switch cells are disposed as proposed in Patent Document 1 so that power supply noise can be further suppressed.

According to an embodiment of the present invention, there is provided a semiconductor integrated circuit including a main-interconnect to which supply voltage or reference voltage is applied, a plurality of sub-interconnects, a plurality of circuit cells configured to be connected to the plurality of sub-interconnects, and a power supply switch cell configured to control, in accordance with an input control signal, connection and disconnection between the main-interconnect and the sub-interconnect to which a predetermined one of the circuit cells is connected, of the plurality of sub-interconnects. The semiconductor integrated circuit further includes an auxiliary interconnect configured to connect the plurality of sub-interconnects to each other.

In the embodiment of the present invention, it is preferable that a plurality of the power supply switch cells be disposed on a line along a direction in parallel to or perpendicular to the direction along which the main-interconnect is disposed and be connected to a plurality of control lines in accordance with a predetermined connection rule.

In the above-described configuration, before the power supply switch cell is turned on, equalization of the amount of accumulated charges among the plurality of sub-interconnects connected to the plurality of circuit cells is carried out via the auxiliary interconnect. Thus, compared with the case of providing no auxiliary interconnect, the peak of power supply noise arising in the main-interconnect when the power supply switch is turned on first is sufficiently suppressed.

The embodiment of the present invention offers an advantage that power supply noise can be suppressed effectively and sufficiently in a semiconductor integrated circuit in which power supply switch transistors are included as cells and the power supply switch cells are properly disposed in the area in which circuit cells are arranged. Furthermore, the embodiment of the present invention offers advantages of reduction in leakage, reduction in the area of the power supply switch cell, and shortening of the design period in defining of the switch cells that should be turned on.

BRIEF DESCRIPTION OF THE DRAWINGS

FIG. 3A is a diagram schematically showing the configuration of an area A1 in the semiconductor integrated circuit relating to the embodiment, and FIGS. 3B1 and 3B2 are diagrams showing the structure of lines along the row direction (interconnect form);

DETAILED DESCRIPTION OF THE PREFERRED EMBODIMENTS

An embodiment of the present invention will be described below with reference to the accompanying drawings.

<Entire Configuration>

Figure 1:
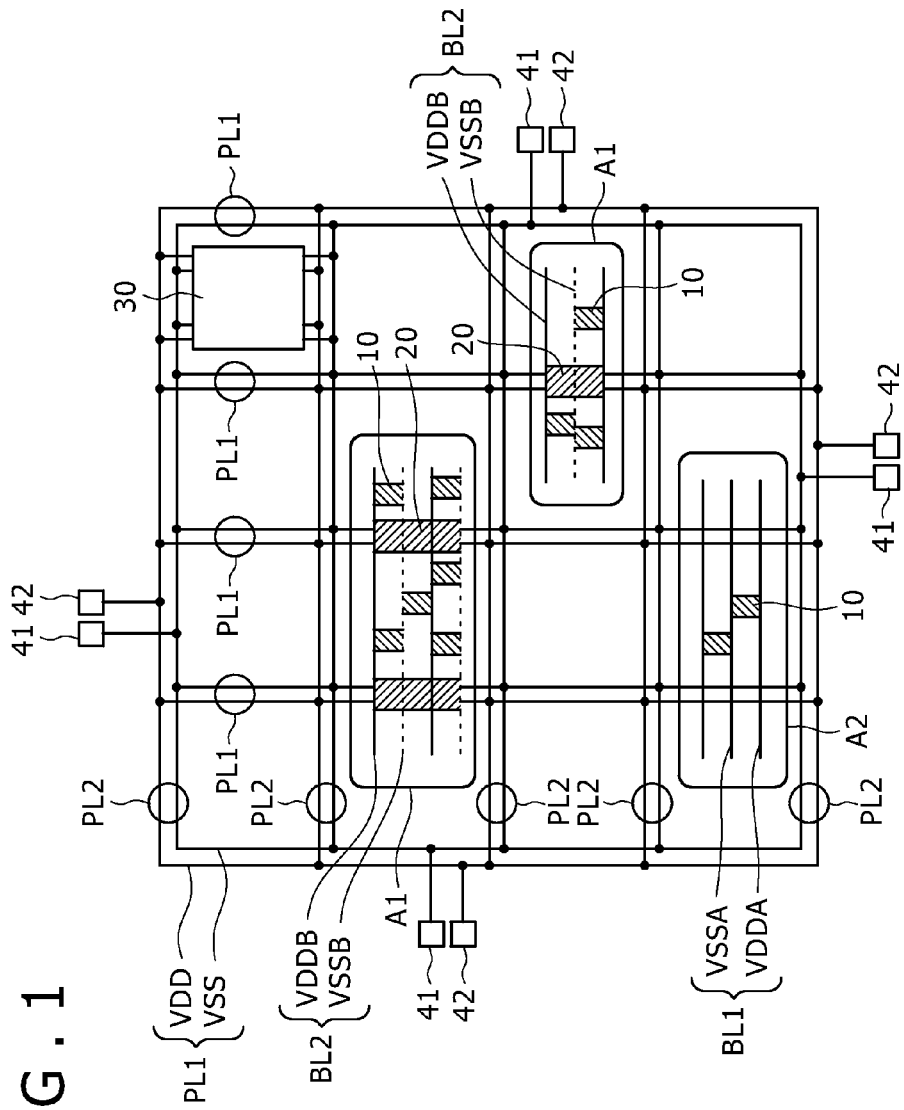
FIG. 1 is a diagram showing one example of the configuration of a semiconductor integrated circuit relating to an embodiment of the present invention.

FIG. 1 is a diagram showing one example of the configuration of a semiconductor integrated circuit relating to the embodiment of the present invention. In FIG. 1, interconnects for supplying supply voltage and reference voltage (e.g. GND voltage) and circuit cells connected to the interconnects are schematically illustrated.

The semiconductor integrated circuit shown in FIG. 1 has plural pairs of power supply lines PL1 as the "main-interconnect", plural pairs of power supply lines PL2, plural branch line groups BL1, plural branch line groups BL2 as the "sub-interconnect", plural circuit cells 10, plural power supply switch cells 20, a circuit block 30, and plural power supply input cells 41 and 42.

The pairs of power supply lines PL1 extend along the column direction, and are disposed in parallel to each other with the intermediary of a predetermined distance therebetween along the row direction.

The pairs of power supply lines PL2 extend along the row direction perpendicular to the pairs of power supply lines PL1, and are disposed in parallel to each other with the intermediary of a predetermined distance therebetween along the column direction.

In FIG. 1, five pairs of power supply lines PL1 and five pairs of power supply lines PL2 intersect with each other, and form a power supply line pattern in a lattice manner as a whole.

In each of the pairs of power supply lines PL1 and PL2, one supply voltage main line VDD and one reference voltage main line VSS are disposed in parallel to each other so as to form one pair. At the intersections in this lattice power supply line pattern, the supply voltage main lines VDD are connected to each other via a contact and the reference voltage main lines VSS are connected to each other via a contact.

In the lattice power supply line pattern, the power supply input cells 41 and 42 are connected to each of the pairs of power supply lines PL1 and PL2 on four outer frames of the power supply line pattern. The reference voltage main line VSS is connected to the power supply input cell 41, and the supply voltage main line VDD is connected to the power supply input cell 42.

Reference voltage Vss is supplied from the external of the semiconductor integrated circuit via the power supply input cell 41. Supply voltage Vdd is supplied from the external of the semiconductor integrated circuit via the power supply input cell 42.

The branch line groups BL1 and BL2 arise from branching from the pair of power supply lines PL1 as the "main-interconnect", and provide power to the circuit cells 10 as the basic unit of the circuit in the semiconductor integrated circuit.

Each of the branch line groups BL1 and BL2 is so formed as to extend along the row direction from the pair of power supply lines PL1 as the "main-interconnect" extending along the column direction.

A plurality of such branch line groups arise from one pair of power supply lines PL1, and the plural circuit cells 10 are connected to each branch line group.

The circuit cell 10 included in the semiconductor integrated circuit receives power supplying from two branch lines connected to this circuit cell 10, i.e., from the branch line to which the supply voltage Vdd is applied and the branch line to which the reference voltage Vss is applied.

On the other hand, a circuit for which blocking of the power supply line is unnecessary, such as a continuous operating circuit, receives power supplying not via a branch line group but directly from a pair of power supply lines, like, for example, the circuit block 30 shown in FIG. 1.

The branch line group BL1 includes a supply voltage branch line VDDA and a reference voltage branch line VSSA as the above-described two branch lines for power supplying to the circuit cells 10. The supply voltage branch line VDDA is connected to the supply voltage main line VDD, and the reference voltage branch line VSSA is connected to the reference voltage main line VSS.

The branch line group BL2 includes a supply voltage branch line VDDB and a reference voltage branch line VSSB as the above-described two branch lines. The supply voltage branch line VDDB is connected to the supply voltage main line VDD, and the reference voltage branch line VSSB is connected to the reference voltage main line VSS.

The difference between the branch line groups BL1 and BL2 is the presence and absence of provision of the power supply switch cell 20. Specifically, the power supply switch cell 20 is provided between the branch line group BL2 and the pair of power supply lines PL1, while the power supply switch cell 20 is not provided between the branch line group BL1 and the pair of power supply lines PL1. Of the branch line groups BL1 and BL2, the branch line group BL2 is equivalent to one example of the "sub-interconnect" because the connection of the branch line group BL2 to the pair of power supply lines PL1 is controlled by the power supply switch cell 20.

A control signal (not shown) is input to the power supply switch cell 20. In response to this signal input, the power supply switch cell 20 can block at least one of the supply voltage and the reference voltage between the pair of power supply lines PL1 and the branch line group BL2. For example, the power supply switch cell 20 includes a power supply switch transistor, and turns off the power supply switch transistor in accordance with the logic level of the input control signal to thereby block the power supply current path to the circuit cell 10 connected to the branch line group BL2.

In the case of a semiconductor integrated circuit of the MTCMOS type, a MOS transistor with threshold voltage higher than that of a transistor of the same conductivity type in the circuit cell 10 is used as the power supply switch transistor. For example, in the case of electrically disconnecting the reference voltage branch line VSSB from the reference voltage main line VSS in accordance with the control signal, an n-type MOS transistor having high threshold voltage is used as the power supply switch transistor. In the case of electrically disconnecting the supply voltage branch line VDDB from the supply voltage main line VDD in accordance with the control signal, a p-type MOS transistor having high threshold voltage is used as the power supply switch transistor.

Figure 2:
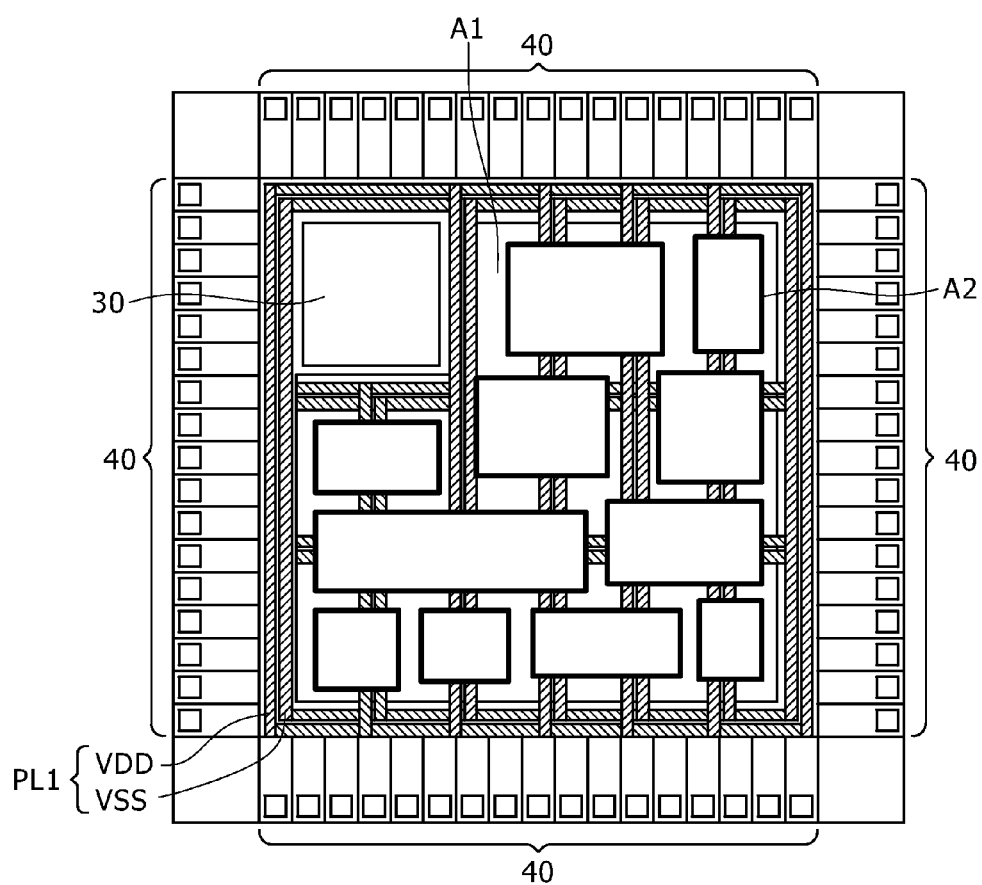
FIG. 2 is a diagram showing one example of the layout of the semiconductor integrated circuit relating to the embodiment.

FIG. 2 is a diagram showing one example of the layout of the semiconductor integrated circuit relating to the present embodiment.

In FIG. 2, numeral "40" indicates input/output cells (hereinafter, referred to as the IO cells) including the power supply input cells 41 and 42. The same symbol or numeral in FIGS. 1 and 2 indicates the same component.

For a rectangular semiconductor chip in which the semiconductor integrated circuit is formed, plural IO cells 40 arranged on a line are disposed on the peripheral part of the semiconductor chip along four sides thereof. In the area surrounded by these IO cells 40, the above-described lattice power supply line pattern is formed.

Referring to FIG. 1, the area inside the outer frame part of the power supply line pattern in FIG. 2 is roughly categorized into an area A1 to which the MTCMOS technique is applied, an area A2 to which the MTCMOS technique is not applied, and the other area to which the MTCMOS technique is not applied. Specifically, the area A1 corresponds to the area in which the circuit cell 10 connected to the branch line group BL2 as the "sub-interconnect" is disposed and for which power supplying can be blocked by the power supply switch cell 20. The area A2 corresponds to the area in which the circuit cell 10 connected to the branch line group BL1 is disposed. The other area corresponds to the area in which a circuit operates through reception of power supplying directly from the pair of power supply lines PL2 (PL1 is also possible) (in FIG. 1, the other area corresponds to the area in which the circuit block 30 is disposed).

The ranges of the areas A1 and A2 shown in FIG. 2 can be flexibly defined through selection as to whether or not to provide the power supply switch cell 20 between the pair of power supply lines PL1 and the branch line group.

<Connection Structure of Control Lines>

In FIGS. 1 and 2, illustration of control lines for controlling the power supply switch cells 20 is omitted. Connection of the control lines to the power supply switch cells 20, suitable for the present embodiment, will be described below.

As shown in FIG. 1, the power supply switch cells 20 are disposed in parallel to the pair of power supply lines PL1 as the "main-interconnect". In the example of FIG. 1, the power supply switch cells 20 are arranged on one line along the column direction.

FIG. 3A is a diagram showing the arrangement in the area A1. FIG. 3A schematically shows the structure of connection of control lines to a row of the power supply switch cells 20.

As shown in FIG. 3A, the power supply switch cells 20 are arranged along the column direction, and are connected to a first control line CL1 at a ratio of one out of four power supply switch cells 20. Furthermore, three consecutive other power supply switch cells 20 between the power supply switch cells 20 connected to the first control line CL1 are connected to a second control line CL2.

A buffer circuit BUF is provided in a proper intermediate position of each of the first control line CL1 and the second control line CL2. The provision of the buffer circuit BUF is to rectify a control signal attenuated in the middle of its transmission into a waveform having the amplitude between the supply voltage Vdd and the reference voltage Vss. The buffer circuit BUF is disposed at least in the IO cells 40 of FIG. 2. In addition, the buffer circuit BUF may be properly disposed in the area surrounded by the IO cells 40 of FIG. 2 as necessary.

Although the above-described example is a connection example of two control lines, three or more control lines may be provided.

In any case, the control lines are connected to the control nodes (the gates of the power supply switch transistors) of the respective power supply switch cells 20 arranged on a line, in accordance with a predetermined connection rule. Although the predetermined connection rule in the above-described example is that "the power supply switch cells 20 are connected at a ratio of one to three", any rule may be optionally employed.

The reason why the plural power supply switch cells 20 are controlled by the plural control lines is as follows.

In the MTCMOS technique, as the way of the provision of the power supply switch transistor (the power supply switch cell 20), the following three ways are available: it is provided between the supply voltage branch line VDDB and the supply voltage main line VDD connected to the circuit cell 10 whose activation and stop are repeated; it is provided between the reference voltage branch line VSSB and the supply voltage main line VDD connected to this circuit cell 10; and it is provided at both of these positions. In the present embodiment, the former two ways can be employed. Moreover, because the drive capability of an n-type MOS transistor is higher than that of a p-type MOS transistor, it is desirable that the power supply switch cell 20 be provided between the reference voltage branch line VSSB and the supply voltage main line VDD connected to the circuit cell 10. In the following, the description will be continued on the premise of this desirable case.

In the area A1 (see FIGS. 1 and 2), to which the MTCMOS technique is applied, if the period of the off-state of the power supplying to the circuit cell 10 is long, the reference voltage branch line VSSB is often charged to high potential due to the transistor leakage current in the circuit cell 10. In this case, if all of the power supply switch cells 20 in the activation-target area are switched from the off-state to the on-state by one control line, large discharge current will flow through the supply voltage main line VDD, and this will result in power supply noise to the other area and the other circuit blocks.

In contrast, if plural control lines are provided as shown in FIG. 3A and control is so carried out that the number of power supply switch cells 20 in the on-state is gradually increased by the plural control lines based on the predetermined connection rule, the peak value of this power supply noise can be suppressed.

The position at which the row of the power supply switch cells 20 is provided may be overlapped with the pair of power supply lines PL1 as shown in FIG. 1. Specifically, the power supply switch transistor of the power supply switch cell 20 is formed in a substrate region below the supply voltage main line VDD as the "main-interconnect" of the pair of power supply lines PL1. By utilizing an interconnect at another layer level, different from the supply voltage main line VDD, of the multilayer interconnect structure, the reference voltage branch line VSSB as the "sub-interconnect" is formed. Furthermore, the connection between the power supply switch transistor and the reference voltage branch line VSSB and the connection between the power supply switch transistor and the reference voltage main line VSS are realized by using contacts.

Various forms are available regarding the multilevel use form, connection, and interconnect pattern of the multilayer interconnect in the overlapping part between the power supply switch cells 20 and the pair of power supply lines PL1. Regarding these points, various forms described in the previous application (Japanese Patent Laid-open No. 2005-259879) by the inventors of the present application can be employed.

In FIG. 3A, each branch line along the row direction is represented as one line. However, in practice, for example, the form of FIG. 3B1 or FIG. 3B2, which shows part A in an enlarged manner, can be employed.

FIG. 3B1 shows the case in which each of the supply voltage branch line VDDB and the reference voltage branch line VSSB is shared by two circuit cells 10 adjacent to each other along the column direction like three circuit cells given numeral "10" in FIG. 3A. In this case, each line along the row direction in FIG. 3A indicates one interconnect, and the supply voltage branch line VDDB and the reference voltage branch line VSSB are alternately disposed along the column direction as a whole.

Figure 4:
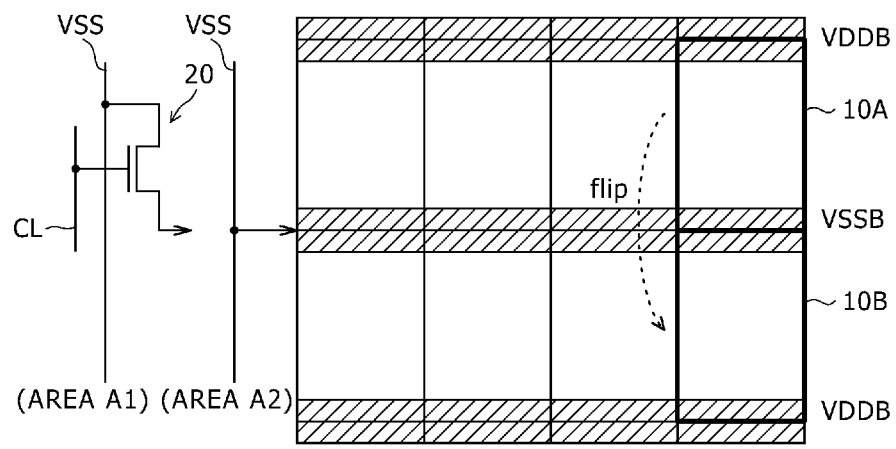
FIG. 4 is a diagram showing the inter-cell connection relationship of the interconnects of FIG. 3B1 based on a 4×2 cell arrangement.

FIG. 4 shows the inter-cell connection relationship of the interconnects of FIG. 3B1 based on a 4×2 cell arrangement.

In FIG. 4, the supply voltage branch line VDDB and the reference voltage branch line VSSB are alternately disposed along the column direction, and each of the supply voltage branch line VDDB and the reference voltage branch line VSSB is shared by two cells adjacent to each other along the column direction. Thus, one cell, for example, a circuit cell 10A (10B), has an interconnect segment having the width half of the width of the supply voltage branch line VDDB and another interconnect segment having the width half of the width of the reference voltage branch line VSSB. Therefore, this interconnect structure will be referred to as the "two-line system."

If the circuit cell group shown in FIG. 4 includes circuit cells for which power supplying is always necessary (in FIG. 1, the circuit cells disposed in the area A2), the reference voltage branch line VSSB is directly connected to the main-interconnect (kept at the reference voltage Vss) along the column direction. On the other hand, if the circuit cell group shown in FIG. 4 includes circuit cells for which power supplying needs to be blocked (in FIG. 1, the circuit cells disposed in the area A1 separately from the area A2), the reference voltage branch line VSSB is connected to the main-interconnect (kept at the reference voltage Vss) via the power supply switch cell 20.

On the assumption that the circuit to be formed is the same and the input/output node is positioned at the center of the cell height (along the column direction, i.e. the vertical direction of FIG. 4), a circuit cell 10B can be disposed through copying of the circuit cell 10A and inversion (flip) thereof about the center line of the reference voltage branch line VSSB.

FIG. 3B2 shows the interconnect structure called the "three-line system" in the above-mentioned previous application (Japanese Patent Laid-open No. 2005-259879). In the three-line system, for example, three reference voltage branch lines VSSB are disposed in proximity to each other, while one supply voltage branch line VDDB is disposed in an isolated manner.

Figure 5:
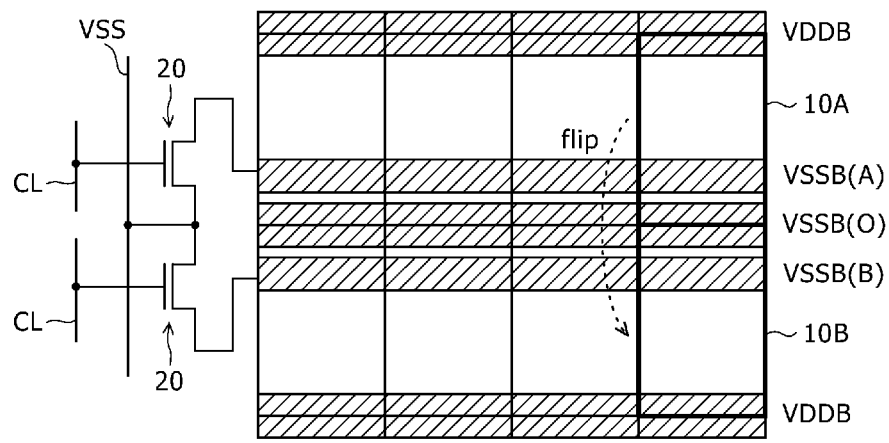
FIG. 5 is a diagram showing the inter-cell connection relationship of the interconnects of FIG. 3B2 based on a 4×2 cell arrangement.

FIG. 5 shows the inter-cell connection relationship of the interconnects of FIG. 3B2 based on a 4×2 cell arrangement.

A reference voltage branch line VSSB(0) as the center line of three adjacent branch lines is shared by two cells adjacent to each other, and the supply voltage branch line VDDB is also shared by two cells adjacent to each other. Thus, for one cell, for example, a circuit cell 10A (10B), the three-line system based on the following three lines is formed: an interconnect segment having the width half of the width of the reference voltage branch line VSSB(0), an interconnect segment having the width half of the width of the supply voltage branch line VDDB, and another reference voltage branch line VSSB(A) (or VSSB(B)) between these interconnect segments.

The purpose of forming the branch line group based on three adjacent reference voltage branch lines VSSB is to allow the circuit cell for which power supply is always necessary (in FIG. 1, the circuit cell disposed in the area A2 separately) to be freely disposed in a branch line group in the area A1.

In the circuit cell 10A shown in FIG. 5, for example, a circuit cell that always receives power supplying and thus should be disposed in the area A2 of FIG. 1 is connected between the reference voltage branch line VSSB(0) as the center line of three adjacent branch lines and the supply voltage branch line VDDB. The power supply switch cell 20 is connected between the center reference voltage branch line VSSB(0) and another reference voltage branch line VSSB(A) (or VSSB(B)), and a circuit cell in the area A1 for which power supplying is controlled by the power supply switch cell 20 is connected between this reference voltage branch line VSSB(A) (or VSSB(B)) and the supply voltage branch line VDDB.

On the assumption that the circuit to be formed is the same and the input/output node is positioned at the center of the cell height (along the column direction, i.e. the vertical direction of FIG. 5), a circuit cell 10B can be disposed through copying of the circuit cell 10A and inversion (flip) thereof about the center line of the reference voltage branch line VSSB.

Even when the reference voltage branch lines VSSB look as one line or two lines as the planar pattern, the interconnect structure is encompassed in the category of the "three-line system" if the reference voltage branch lines VSSB having the function as three lines as described above are formed in the multilayer interconnect structure.

Either the "two-line system" of FIG. 3B1 or the "three-line system" of FIG. 3B2 may be employed optionally. Furthermore, interconnect structures of the different systems may be mounted on different areas of the same semiconductor integrated circuit in a mixed manner.

As specific forms regarding the multilevel use form, connection, and interconnect pattern of the multilayer interconnect in the "two-line system" and the "three-line system", various forms described in the previous application (Japanese Patent Laid-open No. 2005-259879) by the inventors of the present application can be employed.

The following advantages are achieved by the above-described structure in which the interconnect for supplying the supply voltage Vdd or the reference voltage Vss is composed of the main-interconnect (the supply voltage main line VDD or the reference voltage main line VSS) and the sub-interconnect (the supply voltage branch line VDDB or the reference voltage branch line VSSB) and the power supply switch cell 20 is provided between the necessary main-interconnect and sub-interconnect.

Specifically, it is possible to widely disperse the power supply switch cells 20 in the area in which the circuit cell 10 can be disposed and finely carry out blocking of power supplying by the power supply switch cell 20 for each circuit cell group including a comparatively-small number of circuit cells.

Thus, compared with a method of providing a power supply switch for each circuit block, the supply current that flows through the power supply switch cell 20 is reduced, and thus a supply voltage drop is decreased. This can alleviate the influence of the voltage drop arising in the power supply switch cell 20 on signal delay.

Furthermore, compared with a method of disposing a power supply switch outside a circuit block, the flexibility of the arrangement of the power supply switch cell 20 is enhanced, and thus the area A1, for which blocking of power supplying is carried out, can be flexibly defined. This makes it possible to easily realize automatic design of the layout including the power supply switch cell 20. In particular, in the "three-line system", the area A1, for which blocking of power supplying is carried out, and the area A2, for which blocking of power supplying is not carried out, can be formed in one area in a mixed manner without being separated from each other.

This can reduce the burden of the design task, which is tackled based on manpower in a related art, and thus can shorten the development time.

If, of the plural power supply switch cells 20, different cell groups each including a predetermined number of power supply switch cells 20 are separately controlled by plural different control lines, the above-described advantage that the peak value of power supply noise can be suppressed is achieved.

In the present embodiment, in addition to the above-described configuration, an auxiliary interconnect 50 is provided as shown in FIG. 3A for the purpose of achieving a larger effect to suppress the power supply noise. The auxiliary interconnect 50 intersects with the supply voltage branch line VDDB and the reference voltage branch line VSSB disposed along the row direction, and thus is formed of an interconnect layer at a layer level different from that of these branch lines. The auxiliary interconnect 50 connects the reference voltage branch lines VSSB shown in FIGS. 3B1 and 3B2 to each other. However, the auxiliary interconnect 50 may not be connected to a line to which a circuit cell of the area A2, for which blocking of power supplying is not carried out, is connected, such as the center reference voltage branch line VSSB in the interconnect structure including three branch lines disposed adjacent to each other, shown in FIG. 3B2, if there is a need to eliminate the influence of giving signal delay to this circuit cell.

In FIG. 3A, both the configuration in which the power supply switch cells 20 are controlled by plural control lines and the provision of the auxiliary interconnect 50 are employed. However, in the present embodiment, it is sufficient that at least the auxiliary interconnect 50 is provided.

If the auxiliary interconnect 50 is not provided, when the potential of a certain reference voltage branch line VSSB is the highest, charges accumulated in the reference voltage branch line VSSB with this potential are discharged to the reference voltage main line VSS at a burst, and thus the peak of power supply noise arising in the reference voltage main line VSS becomes high.

In contrast, if the auxiliary interconnect 50 is provided, the amount of accumulated charges is equalized among the plural reference voltage branch lines VSSB before this discharging. Thus, providing the auxiliary interconnect 50 connecting the plural reference voltage branch lines VSSB to each other offers an effect to suppress the peak of power supply noise.

The suppression of the peak value of power supply noise can be achieved not only by providing the auxiliary interconnect 50 to thereby equalize the amount of accumulated charges before discharging but also by increasing the connection impedance at the time of power supply switching. That is, this is equivalent to a method of decreasing the size of the outlet of discharged charges.

In the case of controlling the power supply switch cells 20 by plural control lines, the connection impedance at the time of the first power supply switching, which determines the peak value of power supply noise, can be increased compared with the case of simultaneously turning on all of the power supply switch cells 20. Thus, the effect to suppress the power supply noise is achieved.

Employing both the auxiliary interconnect 50 and power supply switching by plural control lines offers the following advantages. Specifically, due to the power supply switching by plural control lines, the amount of charges discharged per unit time from the reference voltage branch line VSSB to the reference voltage main line VSS (the amount of charges that lead to power supply noise) decreases as described above, and thus the effect to suppress the peak of power supply noise is achieved as described above. In addition, due to the equalization of accumulated charges via the auxiliary interconnect 50 before power supply switching, the peak of the power supply noise can be further suppressed.

Consequently, if the auxiliary interconnect 50 is provided, power supply noise can be effectively suppressed attributed to both the provision of the auxiliary interconnect 50 and the power supply switching by plural control lines.

The above-described rule that determines the control of the power supply switch cells 20, such as the ratio of the number of power supply switch cells 20 that are switched on first to the number of power supply switch cells 20 that are switched on subsequently, is determined in consideration of the interconnect resistance, interconnect capacitance, and so on of the auxiliary interconnect 50.

Inversely, in matching with the number of switch transistors that are controlled at one time, the interconnect resistance of the auxiliary interconnect 50 and the layer level used for the auxiliary interconnect 50 may be so determined that the peak of power supply noise can be sufficiently suppressed. However, because the limit regarding the process is imposed on the interconnect resistance of the auxiliary interconnect 50 and the layer level used therefor, the former method, in which the number of power supply switch cells 20 that are switched on at one time is adjusted in matching with the specification of the auxiliary interconnect 50, is easier.

If the power supply switch cells 20 that are connected to the first control line CL1 and are switched on first are uniformly arranged with the intermediary of an equal distance therebetween as shown in FIG. 3A, the effect to suppress power supply noise is further enhanced because such an arrangement manner is suitable for the equalization of the amount of charges by the auxiliary interconnect 50.

Furthermore, if the auxiliary interconnect 50 is provided, the following advantages are achieved due to the equalization of the current that starts to flow from the reference voltage branch line VSSB to the reference voltage main line VSS when the circuit cell 10 is returned from the state in which power supplying thereto is blocked: the transistor size can be decreased; the design is facilitated and thus the design period can be shortened; and leakage current can be reduced. Details of these advantages will be described below.

SPECIFIC EXAMPLES

Figure 6:
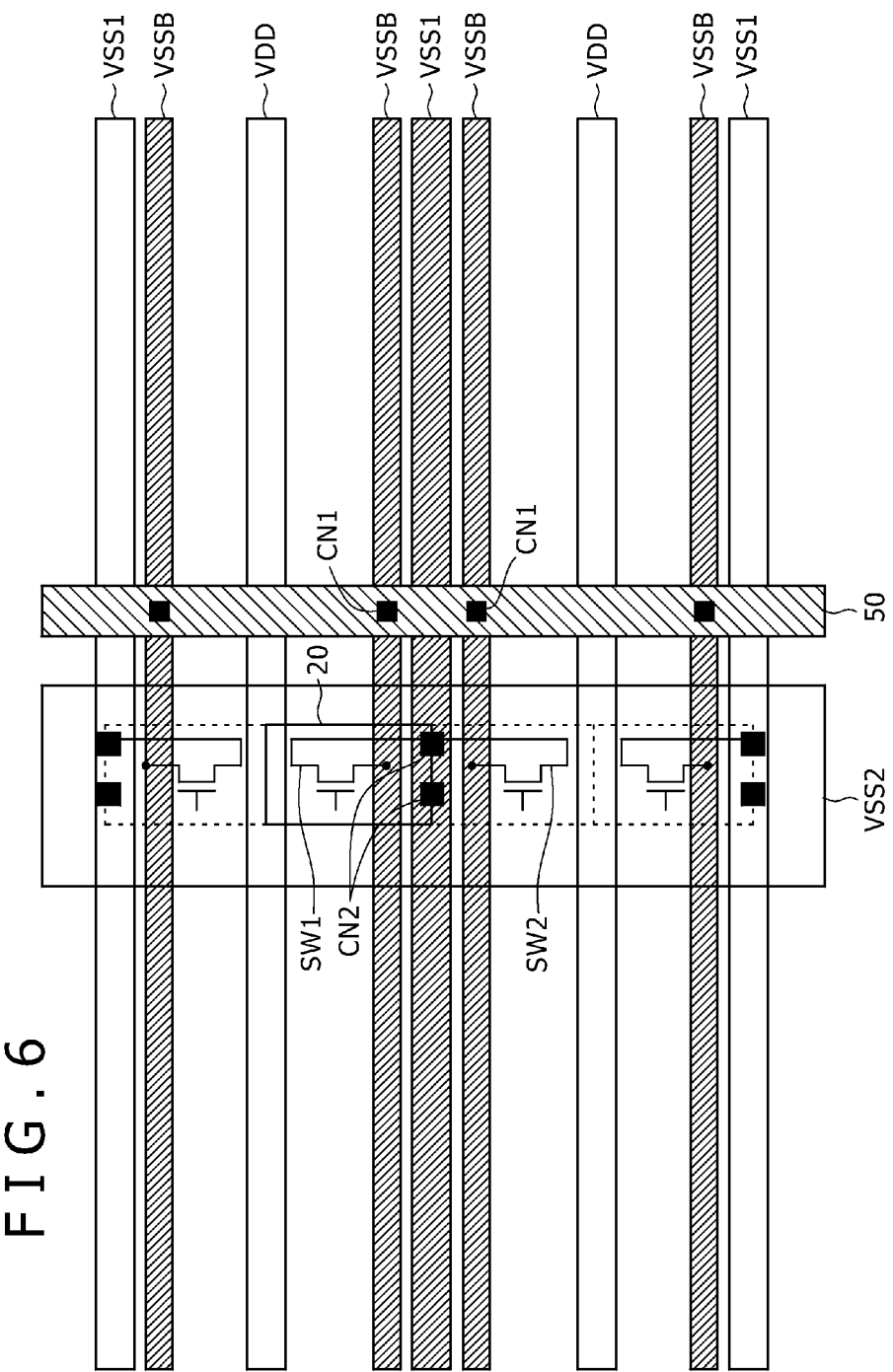
FIG. 6 is a diagram showing a specific form of the connection between interconnects and power supply switch cells in the semiconductor integrated circuit relating to the embodiment.

FIG. 6 is a diagram showing a more specific interconnect example.

In the present example, the above-described reference voltage main line VSS (FIG. 1) along the column direction is composed of a first reference voltage main line VSS1 along the row direction and a second reference voltage main line VSS2 along the column direction, formed of an interconnect layer above that of the first reference voltage main line VSS1. Of these main lines, the first reference voltage main line VSS1 is equivalent to the "main-interconnect".

On both the sides of the first reference voltage main line VSS1 along the width direction thereof, two reference voltage branch lines VSSB are disposed. The reference voltage branch lines VSSB are connected to each other via contacts CN1 and the auxiliary interconnect 50. These first reference voltage main line VSS1 and two reference voltage branch lines VSSB may be formed of an interconnect layer of the same layer level, such as a metal interconnect layer as the second layer.

The first reference voltage main line VSS1 is connected to the second reference voltage main line VSS2 of the upper layer via contacts CN2. In a substrate region below the interconnect layer level of the first reference voltage main line VSS1, power supply switch transistors SW1 and SW2 are formed. The power supply switch transistor SW1 is connected between one reference voltage branch line VSSB and the first reference voltage main line VSS1, and the power supply switch transistor SW2 is connected between the other reference voltage branch line VSSB and the first reference voltage main line VSS1.

The above-described configuration is repeated along the column direction.

In the configuration shown in FIG. 6, when one of the power supply switch transistors SW1 and SW2 is turned on, charges in the reference voltage branch line VSSB connected to the turned-on transistor, of two reference voltage branch lines VSSB disposed on both the sides of the first reference voltage main line VSS1, are discharged via the turned-on transistor. At this time, because the reference voltage branch lines VSSB are connected to each other by the auxiliary interconnect 50, charges accumulated in the other reference voltage branch line VSSB move in linkage with the decrease in the potential of the reference voltage branch line VSSB from which the charges are discharged via the turned-on transistor. This can decrease the charges accumulated in the other reference voltage branch line VSSB, too. However, the peak value of power supply noise is determined by the amount of charges accumulated in the reference voltage branch line VSSB connected to the power supply switch transistor SW1 at the initial stage of the turning-on of the power supply switch transistor SW1, and does not depend on the amount of charges that move slowly due to the auxiliary interconnect 50 after the turning-on of the transistor SW1. Therefore, due to the equalization of the amount of charges that should be discharged before power supply switching, the charge discharging that determines the peak value of power supply noise is slow, which suppresses the power supply noise arising in the second reference voltage main line VSS2.

Figure 7:
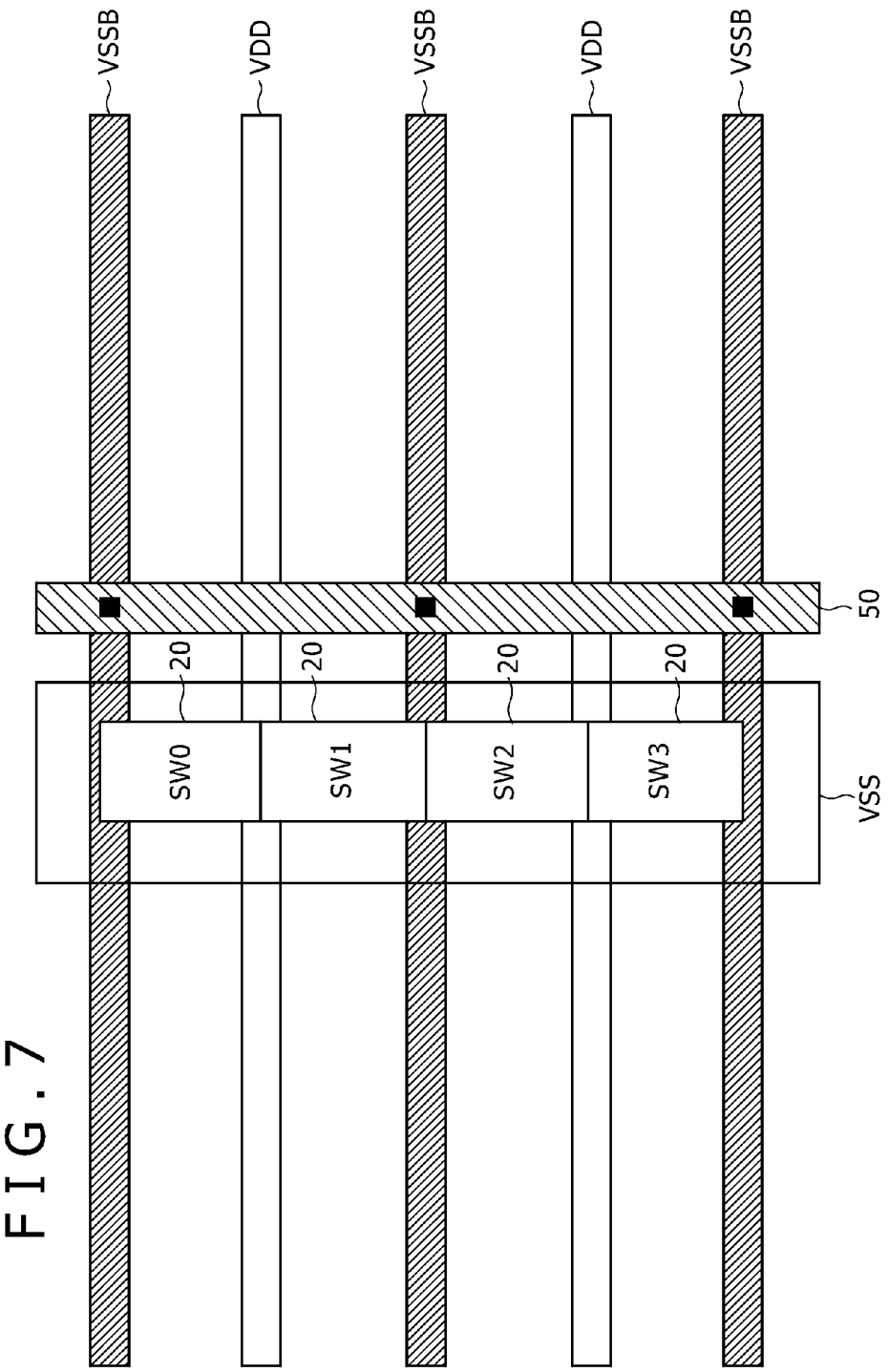
FIG. 7 is a diagram showing another specific interconnect form of the semiconductor integrated circuit relating to the embodiment.

Another specific example is shown in FIG. 7.

In this example, the reference voltage branch line VSSB and the supply voltage main line VDD are alternately disposed. This arrangement corresponds to the "two-line system" similar to that of FIG. 3B1. However, in FIG. 7, the supply voltage main line VDD is disposed along the row direction and has no branch line, unlike the structure of FIG. 3B1.

Furthermore, the power supply switch cell 20 including the power supply switch transistor SW1 of FIG. 6 and the power supply switch cell 20 including the second switch SW2 are so disposed as to share the reference voltage branch line VSSB. Adjacent to the power supply switch transistor SW1, a power supply switch transistor SW0 that shares the supply voltage main line VDD with the power supply switch transistor SW1 is disposed. Adjacent to the power supply switch transistor SW2, a power supply switch transistor SW3 that shares the supply voltage main line VDD with the power supply switch transistor SW2 is disposed.

In order to achieve the effect to suppress power supply noise similar to the above-described effect, the reference voltage branch lines VSSB are connected to each other by the auxiliary interconnect 50.

Figure 8:
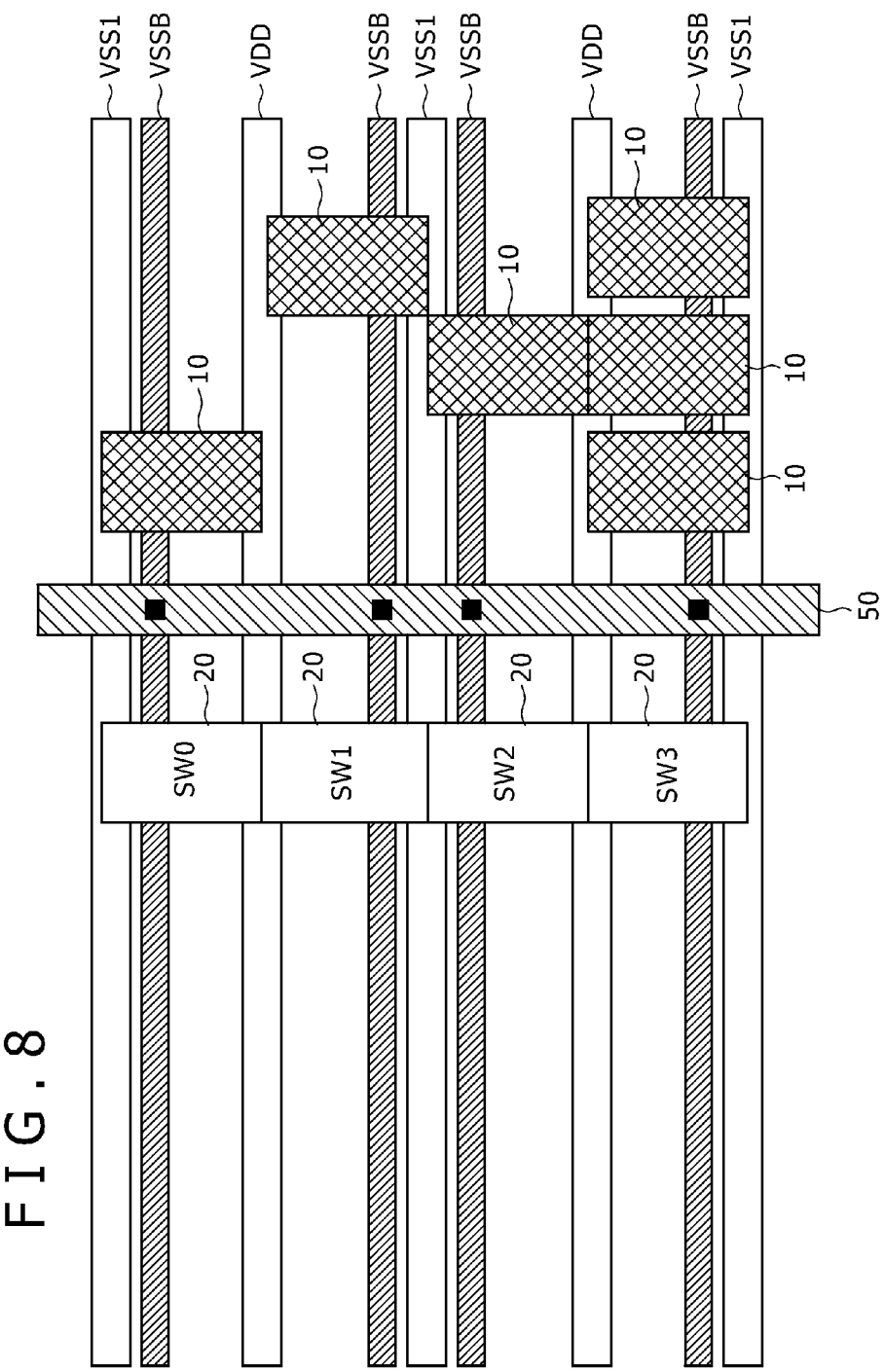
FIG. 8 is a diagram that arises from partial modification of FIG. 6 and is used for explaining advantages of the semiconductor integrated circuit relating to the embodiment.

FIG. 8 shows a configuration obtained by adding the circuit cells 10 arranged at random to the configuration of FIG. 6. With reference to FIG. 8, a description will be made below about an effect to decrease variation in the power consumption at the time of the operation of the circuit cells, attributed to the provision of the auxiliary interconnect 50, and other effects. In FIG. 8, illustration of the second reference voltage main line VSS2 is omitted.

The circuit cells 10 are arranged at random as shown in FIG. 8, for example. The operation patterns of the respective circuit cells 10 are also not uniform but determined based on operation assumed at the time of the design. Therefore, the VSS potentials of the respective circuit cells 10 greatly vary depending on the places of the circuit cells and the time. Thus, the plural circuit cells 10 involve variation in the power consumption at the time of the operation thereof although they have the same circuit configuration. Consequently, if it is assumed that the auxiliary interconnect 50 is not provided, the currents that flow through four reference voltage branch lines VSSB in FIG. 8 also vary. In the case of selecting the switches that should be switched on based on prediction of this variation, the currents that flow through the respective reference voltage branch lines VSSB need to be predicted from the power consumption values of the respective circuit cells 10, which dynamically change. Therefore, it is expected that the design involves a lot of trouble and the design period increases. In addition, in order to assure the desired operation, the switches SW0 to SW3 need to be designed to have a size larger than the necessary size, with some degree of margin. Such a switch with a large size has low on-resistance and high capability of charge discharging, and thus enhances the safeness to assure the operation. However, such a switch involves disadvantages of causing increase in the circuit area and increase in leakage current.

In the present embodiment, these disadvantages are eliminated because the auxiliary interconnect 50 is provided. Specifically, the movement of charges via the auxiliary interconnect 50 eliminates variation in the current among the reference voltage branch lines VSSB. Therefore, no matter which of the switches SW0 to SW3 is switched on, the equalized current will flow through the selected and turned-on switch.

Consequently, the provision of the auxiliary interconnect 50 facilitates the selection of the power supply switch cell 20. As a result, the power supply switch cells 20 can be formed by the switches SW0 to SW3 having the minimum necessary size. This results in achievement of an effect to reduce leakage current, an effect to decrease the area of the power supply switch cell 20, and an effect to shorten the design period.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor integrated circuit, comprising:
   a plurality of circuit cells;
   a plurality of sub wiring lines disposed in a first direction and individually shared by predetermined ones of the plural circuit cells, a plurality of the predetermined ones of the plural circuit cells being juxtaposed in the first direction;
   a plurality of power supply switch cells for controlling connection and disconnection between individual sub wiring lines and said main wiring line in response to a control signal inputted thereto; and
   an auxiliary wiring line for connecting the plural sub wiring lines to each other, the auxiliary wiring line extending in a second direction that is perpendicular to the first direction,
   wherein the predetermined ones of the plural circuit cells include a first circuit cell that is located at a left side of one of the sub wiring lines and a second circuit cell that is located at a right side of said one of the sub wiring lines.

2. A semiconductor integrated circuit as set forth in claim 1, wherein said one of the power supply switch cells and said second one of the power supply switch cells are simultaneously controllable by a control signal on the control line.

3. A semiconductor integrated circuit as set forth in claim 1, wherein said first direction differs from said second direction.

4. A semiconductor integrated circuit as set forth in claim 1, wherein said first direction is perpendicular to said second direction.

5. A semiconductor integrated circuit as set forth in claim 1, wherein said main line crosses said branch lines.

6. A semiconductor integrated circuit as set forth in claim 1, wherein said control line crosses said branch lines.

7. A semiconductor integrated circuit as set forth in claim 1, wherein a portion of the interconnect layer is between said main line and said row of the power supply switch cells.

8. A semiconductor integrated circuit as set forth in claim 1, further comprising:
a contact directly electrically connecting said main line to one of the branch lines, said one of the branch lines being directly electrically connected to said one of the power supply switch cells.

9. A semiconductor integrated circuit as set forth in claim 8, wherein said contact is between said main line and said one of the branch lines.

10. A semiconductor integrated circuit as set forth in claim 8, further comprising:
an auxiliary line directly electrically connected to a second one of the branch lines, said auxiliary line extending along said first direction.

11. A semiconductor integrated circuit as set forth in claim 10, wherein said auxiliary line is in said upper layer.

12. A semiconductor integrated circuit as set forth in claim 10, wherein said main line is between said control line and said auxiliary line.

13. A semiconductor integrated circuit as set forth in claim 10, further comprising:
a circuit cell directly electrically connected said one of the branch lines and another of the branch lines, said auxiliary wiring line being between said main line and said circuit cell.

14. A semiconductor integrated circuit as set forth in claim 13, wherein a threshold voltage for a transistor in one of the circuit cells is higher than a threshold voltage for a transistor in said one of the power supply switch cells.

15. A semiconductor integrated circuit as set forth in claim 10, wherein said one of the power supply switch cells is controllable to provide electrical connection and disconnection between said one of the branch lines and said second one of the branch lines.

16. A semiconductor integrated circuit as set forth in claim 15, wherein said second one of the power supply switch cells is controllable to provide electrical connection and disconnection between said one of the branch lines and a third one of the branch lines.

17. A semiconductor integrated circuit as set forth in claim 1, further comprising:
a third one of the power supply switch cells directly electrically connected to said control line, said third one of the power supply switch cells being controllable to provide electrical connection and disconnection between said main line and another of the branch lines.

18. A semiconductor integrated circuit as set forth in claim 17, wherein said one of the power supply switch cells is between said second one of the power supply switch cells being and said third one of the power supply switch cells.

19. A semiconductor integrated circuit as set forth in claim 1, further comprising:
a different control line extending along said first direction, a different one of the power supply switch cells being directly electrically connected to said different control line.

20. A semiconductor integrated circuit comprising:
an interconnect layer of the semiconductor integrated circuit between a substrate region of the semiconductor integrated circuit and an upper layer of the semiconductor integrated circuit;
a main line in said upper layer, said main line extending along a first direction;
branch lines in said interconnect layer, said branch lines extending along a second direction;
a row of power supply switch cells in said substrate region, said row of the power supply switch cells extending along said first direction;
a control line extending along said first direction, one of the power supply switch cells and a second one of the power supply switch cells being directly electrically connected to said control line.

* * * * *